United States Patent
He et al.

(10) Patent No.: US 9,543,960 B1
(45) Date of Patent: Jan. 10, 2017

(54) MULTI-STAGE FREQUENCY DIVIDERS HAVING DUTY CYCLE CORRECTION CIRCUITS THEREIN

(71) Applicant: Integrated Device Technology, Inc., San Jose, CA (US)

(72) Inventors: Chengming He, Chandler, AZ (US); Ruben Eribes, Chandler, AZ (US); Denny Nathaniel Castile, Mesa, AZ (US)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 14/966,913

(22) Filed: Dec. 11, 2015

Related U.S. Application Data

(60) Provisional application No. 62/197,986, filed on Jul. 28, 2015.

(51) Int. Cl.
| | |
|---|---|
| *H03K 21/00* | (2006.01) |
| *H03K 23/00* | (2006.01) |
| *H03K 25/00* | (2006.01) |
| *H03K 21/10* | (2006.01) |
| *H03K 7/08* | (2006.01) |

(52) U.S. Cl.
CPC .............. *H03K 21/10* (2013.01); *H03K 7/08* (2013.01)

(58) Field of Classification Search
USPC ........ 327/115, 116, 117, 118, 355–361, 202, 327/203, 208–212, 218; 377/47, 48
See application file for complete search history.

(56) References Cited

U.S. PATENT DOCUMENTS

| | | | | |
|---|---|---|---|---|
| 6,035,182 A * | 3/2000 | Shurboff | .............. | H03K 23/667 327/117 |
| 6,501,816 B1 * | 12/2002 | Kouznetsov | ......... | H03K 23/667 327/115 |
| 6,725,245 B2 * | 4/2004 | Bucska | ................ | H03K 23/665 708/103 |
| 6,760,397 B2 | 7/2004 | Wu et al. | | |

(Continued)

OTHER PUBLICATIONS

Cicero S. Vaucher et al., "A Family of Low-Power Truly Modular Programmable Dividers in Standard 0.35-um CMOS Technology," IEEE JSSC, vol. 35, No. 7, Jul. 2000, pp. 1039-1045.

(Continued)

*Primary Examiner* — Brandon S Cole
(74) *Attorney, Agent, or Firm* — Myers, Bigel & Sibley P.A.

(57) ABSTRACT

A multi-stage frequency divider includes a cascaded arrangement of first and second integer dividers configured to collectively divide a frequency of a periodic reference signal by an integer amount equal to a product of (2N+1) and (2M+1), where N and M are unequal positive integers greater than two. A duty cycle enhancement circuit is provided, which is synchronized to the periodic reference signal and configured to generate a periodic signal having 2MN+N+M cycles of high followed by 2MN+N+M+1 cycles of low or vice versa, where a duration of each cycle is equivalent to a period of the periodic reference signal. A duty cycle correction circuit is provided as a final stage and is configured to generate a periodic output signal having a uniform duty cycle from the periodic signal generated by the duty cycle enhancement circuit.

10 Claims, 4 Drawing Sheets

(56) References Cited

U.S. PATENT DOCUMENTS

| | | | |
|---|---|---|---|
| 7,170,965 B2 * | 1/2007 | Chien | ................. H03K 21/10 327/147 |
| 8,559,587 B1 | 10/2013 | Buell et al. | |
| 9,118,333 B1 | 8/2015 | Mika et al. | |
| 2004/0196940 A1 * | 10/2004 | Chien | ................. H03K 21/10 375/376 |

OTHER PUBLICATIONS

Yu-Che Yang et al., "A Dual-Mode Truly Modular Programmable Fractional Divider Based on a 1/1.5 Divider Cell," IEEE Microwave and Wireless Components Letters, vol. 15, No. 11, Nov. 2005, pp. 754-756.

U.S. Appl. No. 14/136,012, Margarit et al., "Half-Integer Frequency Dividers That Support 50% Duty Cycle Signal Generation," filed Dec. 20, 2013, 21 pages.

U.S. Appl. No. 14/573,146, Brian Buell, "Fractional Divider Based Phase Locked Loops with Digital Noise Cancellation," filed Dec. 17, 2014, 29 pages.

U.S. Appl. No. 14/575,212, Buell et al., "Self-Calibrating Fractional Divider Circuits," filed Dec. 18, 2014, 34 pages.

* cited by examiner

MULTI-STAGE FREQUENCY DIVIDERS HAVING DUTY CYCLE CORRECTION CIRCUITS THEREIN

REFERENCE TO PRIORITY APPLICATION

This application claims priority to U.S. Provisional Application Ser. No. 62/197,986, filed Jul. 28, 2015, the disclosure of which is hereby incorporated herein by reference.

FIELD OF THE INVENTION

The present invention relates to integrated circuit devices and, more particularly, to frequency dividers used in clock generation circuits.

BACKGROUND OF THE INVENTION

Phase-locked loop (PLL) integrated circuits are frequently used to generate clock signals for synchronous integrated circuit systems. As will be understood by those skilled in the art, PLL integrated circuits may multiply a reference clock frequency by some number to thereby generate a relatively high frequency clock. This multiplying number can be a fractional number if fractional dividers are utilized in a feedback loop of the PLL. One typical technique to implement a fractional divider is to utilize a multi-modulus divider (MMD) with a delta-sigma modulator (DSM), which outputs a sequence of integer numbers having a fractional average value. The MMD uses these integer numbers as divisors. For example, these integer numbers can be any one of [N1, N2], where N1 and N2 are determined by the desired fractional number and the DSM order. To achieve proper operation, there should be no delays or intermediate divisors of the MMD. One example of fractional divider is disclosed in commonly assigned U.S. Pat. No. 8,559,587 entitled "Fractional-N Dividers Having Divider Modulation Circuits Therein with Segmented Accumulators," the disclosure of which is hereby incorporated herein by reference.

An example of a programmable MMD with extended range is disclosed in an article by Cicero S. Vaucher et al., entitled "A Family of Low-Power Truly Modular Programmable Dividers in Standard 0.35-um CMOS Technology," IEEE JSSC, Vol. 35, No. 7, July 2000. A shown by FIGS. 1-2, a portion of this MMD 100 includes several stages of div2/3 cells 110 and logic circuits (e.g., OR gates, inverters). Each div2/3 cell includes four (4) level-sensitive D-type latches and three (3) AND gates, connected as illustrated. When signal MODin=1 and signal P=1, a divide-by-3 function is realized so that the states 201, 202 change as follows: (0,1)→(1,1)→(0,1). In addition, when signal MODin=0 and signal P=X (i.e., X=0 or 1), a divide-by-2 function is realized so that the states 201, 202 of corresponding D-type latches change as follows: (0,1)→(1,1)→(0,1). Thus, when node 201 is logic 1, MODout repeats the value of MODin and when node 201 is logic 0, MODout is logic 0, with the latch states changing at negative edges of signal Fin. As shown by FIG. 1, each stage of div2/3 cells samples its own MODin and generates its own MODout, with the rightmost input MODin being set high to a logic "1" value. Based on this configuration, each MODout signal is a positive pulse with the pulse width being one period of its own Fin. During this period, each stage has one chance to perform a "check", when its MODin is high, to determine whether it is supposed to function as a divide-by-3 cell or a divide-by-2 cell depending on its input P. The period of Fout (i.e., Tout) is related to the period of Fin (i.e., Tin) as follows:

$$Tout=Tin(P<0>+P<1>2^1+\ldots+P<n-1>2^{n-1}+P<n>2^n),$$

which means the divisor is equivalent to the binary number $P<n:0>$ ($2\leq P<n:0>\leq 2^{n+1}-1$). Unfortunately, one problem with the MMD of FIGS. 1-2 is that when a new $P<n:0>$ is loaded, the divisor does not directly change to the new divisor, but can get an uncertain intermediate value before becoming the new value. This property of the MMD of FIGS. 1-2 is not acceptable for fractional divider applications where any discrepancy will result in an error division ratio. U.S. Pat. No. 6,760,397 to Wu et al. and U.S. Pat. No. 6,501,816 to Kouznetsov et al. also disclose efforts to develop multi-modulus dividers for programmable frequency divider and fractional-N divider applications.

Still further conventional dividers may use cascaded chains of cells that divide by two or three as a function of a modulus control bit (MC) (e.g., ÷2 for MC=0, ÷3 for MC=1). Thus, a cascade of N cells can take any divide ratio from $2^N$ to $2^{N+1}-1$ as a function of $MC_1$ through $MC_N$. Unfortunately, the duty cycle of the output divided frequency is typically less than 50%, which is a requirement for many frequency generating circuits for timing applications. A typical solution to achieve the 50% duty cycle requirement is to terminate the frequency divider chain by a divide-by-two flip-flop, which is triggered only by rising (or falling) edges at its input. As will be understood by those skilled in the art, the output of the flip-flop is high for one period of the incoming signal and low for the next period, such that the duty cycle is always 50%. But, with this solution, the output divide ratios can only take even values (e.g., 4, 6, 8, 10 . . . ). An attempt to correct this limitation by providing multi-modulus dividers that support 50% duty cycle output signals is disclosed in an article by Yu-Che Yang et al., entitled "A Dual-Mode Truly Modular Programmable Fractional Divider Based on a 1/1.5 Divider Cell," IEEE Microwave and Wireless Components Letters, Vol. 15, No. 11, pp. 754-756, November (2005).

Still further examples of frequency dividers that support 50% duty cycle generation are disclosed in U.S. application Ser. No. 14/136,012, filed Dec. 20, 2013, entitled "Half-Integer Frequency Dividers That Support 50% Duty Cycle Signal Generation," and U.S. application Ser. No. 14/013, 599, filed Aug. 29, 2013, entitled "Self-Adaptive Multi-Modulus Dividers Containing DIV2/3 Cells Therein," the disclosures of which are hereby incorporated herein by reference. Examples of fractional divider circuits are disclosed in U.S. application Ser. No. 14/573,146, filed Dec. 17, 2014, entitled "Fractional Divider Based Phase Locked Loops with Digital Noise Cancellation," and U.S. application Ser. No. 14/575,212, filed Dec. 18, 2014, entitled "Self-Calibrating Fractional Divider Circuits," the disclosures of which are hereby incorporated herein by reference.

SUMMARY OF THE INVENTION

A multi-stage frequency divider according to some embodiments of the invention includes a divider circuit, which is responsive to a periodic reference signal (e.g., REFCLK) to be divided. In some embodiments, the divider circuit may have at least first and second integer dividers therein, which are electrically coupled in a cascaded arrangement so that the second integer divider receives, at an input thereof, an intermediate divider signal derived (directly or indirectly) from a first output of the first integer divider. A duty cycle enhancement circuit is also provided, which is configured to generate an intermediate output signal having an N/N+1 duty cycle in response to at least first and second output signals generated by the divider circuit. In some embodiments of the invention, N is a positive integer and 2N+1 equals a product of a first divide value of the first integer divider and a second divide value of the second integer divider, and at least one of the first and second output signals has a duty cycle less than the N/N+1 duty cycle. A final duty cycle correction circuit is also provided, which is configured to generate a periodic output signal (OUT) having a uniform (i.e., 50%) duty cycle and a period (T) equal to the product times a period of the periodic reference signal, in response to the intermediate output signal having the N/N+1 duty cycle.

According to further embodiments of the invention, the divider circuit may include a first retimer circuit, which is configured to generate the intermediate divider signal by adjusting a phase of a periodic signal generated at the first output of the first integer divider. This first retimer circuit can be responsive to the periodic reference signal (REF-CLK).

According to additional embodiments of the invention, the duty cycle enhancement circuit and the duty cycle correction circuit are configured to collectively support generation of the periodic output signal having a uniform duty cycle when the first and second integer dividers are both supporting respective odd integer frequency division (e.g., 3, 5, 7, . . . ) therein. According to still further embodiments of the invention, the duty cycle enhancement circuit is responsive to the periodic reference signal and is configured to delay an output signal generated by the second integer divider by M cycles of the periodic reference signal, where M is a positive integer and 2M+1 equals a magnitude of the frequency division performed by the first integer divider. In addition, the duty cycle enhancement circuit may be further configured to generate an output signal by performing a logical QR of the output signal generated by the second integer divider and the M-cycle delayed version of the output signal generated by the second integer divider.

According to further embodiments of the invention, the duty cycle correction circuit is configured to: (i) generate a first preliminary output signal by performing a logical OR of a half-cycle delayed version of the intermediate output signal and a 1.5-cycle delayed version of the intermediate output signal; and (ii) generate a second preliminary output signal as a one-cycle delayed version of the intermediate output signal. Still further, the duty cycle correction circuit may be configured to generate the periodic output signal by multiplexing the first preliminary output signal and the second preliminary output signal using the periodic reference signal as a multiplexer select signal, which means an output of the multiplexer may toggle between the first and second preliminary output signals.

According to additional embodiments of the invention, a multi-stage frequency divider includes a cascaded arrangement of first and second integer dividers configured to collectively divide a frequency of a periodic reference signal by an integer amount equal to a product of (2N+1) and (2M+1), where N and M are unequal positive integers greater than two. A duty cycle enhancement circuit is also provided, which is synchronized to the periodic reference signal and configured to generate a periodic signal having 2MN+N+M cycles of high followed by 2MN+N+M+1 cycles of low or vice versa, where a duration of each cycle is equivalent to a period of the periodic reference signal. A duty cycle correction circuit is also provided as a final stage and is configured to generate a periodic output signal having a uniform duty cycle from the periodic signal generated by the duty cycle enhancement circuit.

DETAILED DESCRIPTION OF EMBODIMENTS

Figure 1:
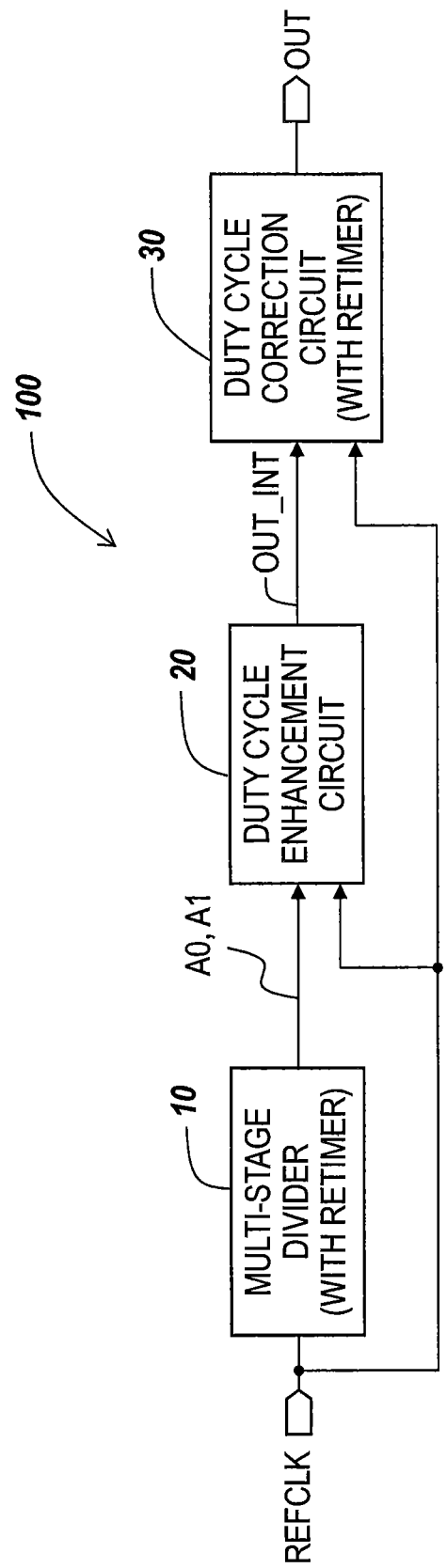
FIG. 1 is a block diagram of a multi-stage frequency divider with duty cycle correction according to an embodiment of the present invention.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that when an element is referred to as being "on," "connected to" or "coupled to" another element or layer (and variants thereof), it can be directly on, connected or coupled to the other element or intervening elements may be present. In contrast, when an element is referred to as being "directly on," "directly connected to" or "directly coupled to" another element (and variants thereof), there are no intervening elements present. Like reference numerals refer to like elements throughout.

It will be understood that, although the terms first, second, third. etc., may be used herein to describe various elements, components, regions and/or sections, these elements, components, regions and/or sections should not be limited by these terms. These terms are only used to distinguish one element, component, region or section from another element, component, region or section. Thus, a first element, component, region or section discussed below could be termed a second element, component, region or section without departing from the teachings of the present invention.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
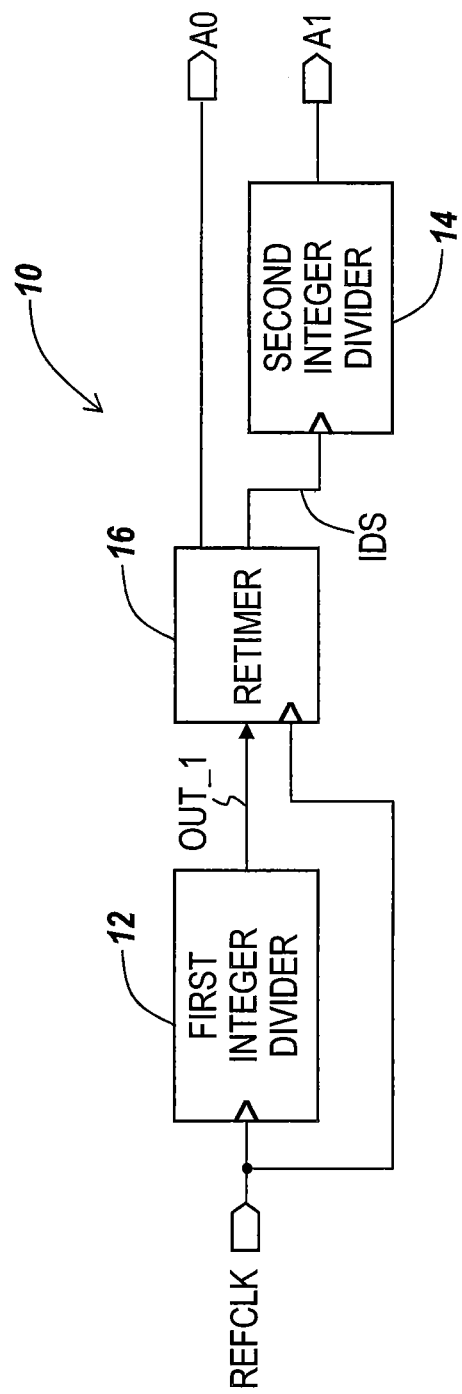
FIG. 2 is a block diagram of a multi-stage integer divider according to an embodiment of the present invention.

Referring now to FIGS. 1-5, a multi-stage frequency divider 100 according to some embodiments of the invention includes a multi-stage divider circuit 10, which is responsive to a periodic reference signal (e.g., REFCLK) to be divided. As shown by FIG. 2, the divider circuit 10 may have at least first and second integer dividers 12, 14 therein, which are electrically coupled in a cascaded arrangement so that the second integer divider 14 receives, at an input thereof, an intermediate divider signal IDS derived (directly or indirectly) from a first output of the first integer divider 12. As shown by FIG. 2, the intermediate divider signal IDS and an output signal A0 are generated by a retimer circuit 16, which is synchronized with REFCLK and configured to adjust a phase of a periodic signal OUT_1 generated at the first output of the first integer divider 12. According to some embodiments of the invention, the relative phases of the IDS and the output signal A0 may be equivalent (or different) and the second integer divider 14 may generate an output signal A1 having a different frequency and duty cycle relative to the IDS, as illustrated more fully hereinbelow for the case that the first integer divider 12 and second integer divider 14 both perform a divide-by-3 frequency division. In particular, the retimer circuit 16 may be configured to support the following timing relationship: IDS=A0=OUT_1($z^{-1}$), where "$z^{-1}$" designates one full period of the signal undergoing retiming. In addition, the first and second integer dividers 12, 14 may be controlled to perform many combinations of integer division with both odd and even divider values (e.g., /1, /2, /3, /4, /5, etc.).

Figure 3A:
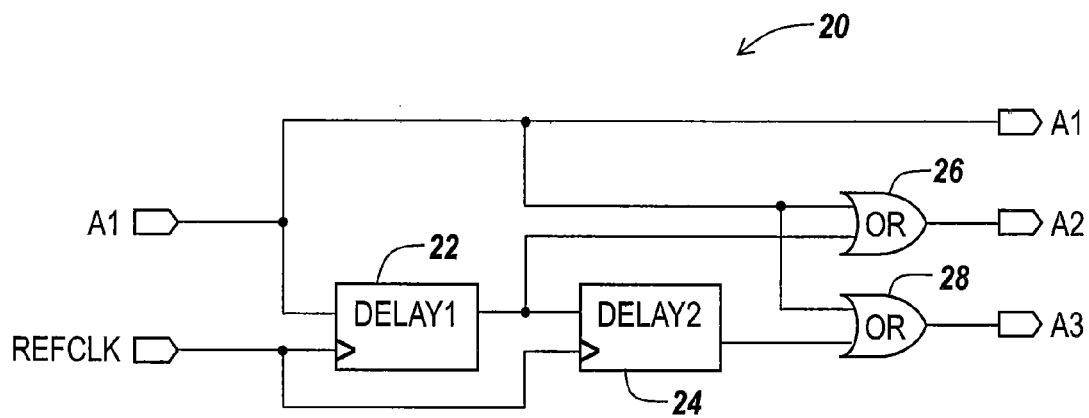
FIG. 3A-3B illustrate a duty cycle enhancement circuit according to an embodiment of the present invention.
Figure 3B:
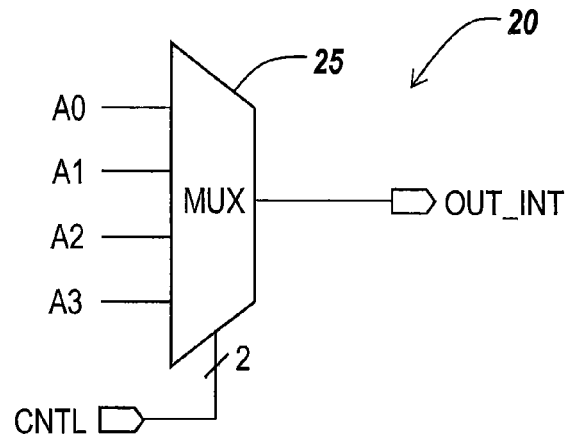
Figure 4:
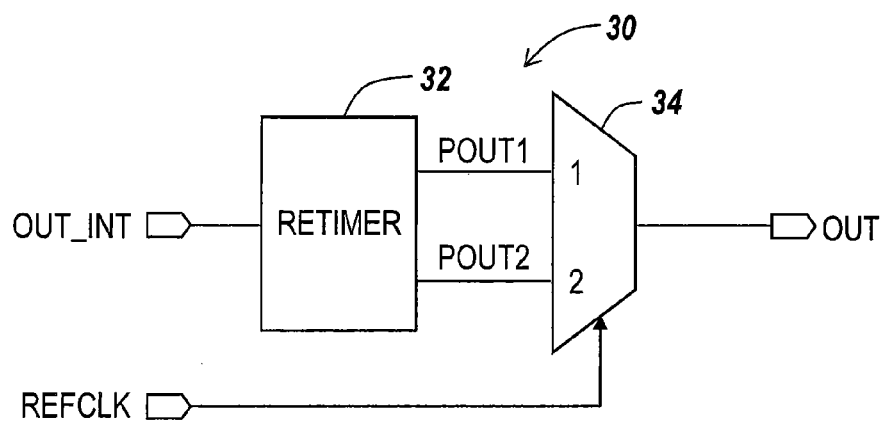
FIG. 4 is a block diagram of a duty cycle correction circuit according to an embodiment of the present invention.

As shown by FIGS. 1 and 3A-3B, a duty cycle enhancement circuit 20 is also provided, which is configured to generate an intermediate output signal OUT_INT having an N/N+1 duty cycle in response to at least first and second output signals A0, A1 generated by the multi-stage divider circuit 10. In some embodiments of the invention, N is a positive integer and 2N+1 equals a product (P) of a first divide value of the first integer divider 12 (e.g., 3) and a second divide value of the second integer divider 14 (e.g., 3), and at least one of the first and second output signals A0, A1 has a duty cycle less than the N/N+1 duty cycle. As shown by FIGS. 1 and 4, a final duty cycle correction circuit 30 is also provided, which is configured to generate a periodic output signal OUT having a uniform (i.e., 50%) duty cycle and a period (T) equal to the product (P) times a period of the periodic reference signal REFCLK, in response to the intermediate output signal OUT_INT having the non-uniform N/N+1 duty cycle.

As will now be described more fully with respect to FIGS. 2-5, the duty cycle enhancement circuit 20 and the duty cycle correction circuit 30 are configured to collectively support generation of the periodic output signal OUT having a uniform (i.e., 50%) duty cycle when the first and second integer dividers 12, 14 are both supporting respective odd integer frequency division (e.g., 3, 5, 7, . . . ) therein. As shown by FIGS. 3A-3B, the duty cycle enhancement circuit 20 is responsive to the periodic reference signal REFCLK and is configured to delay the output signal A1 generated by the second integer divider by M cycles of the periodic reference signal (using a series of delay elements 22, 24 (e.g., latches)), where M is a positive integer and 2M+1 equals a magnitude of the frequency division performed by the first integer divider 12.

Figure 5:
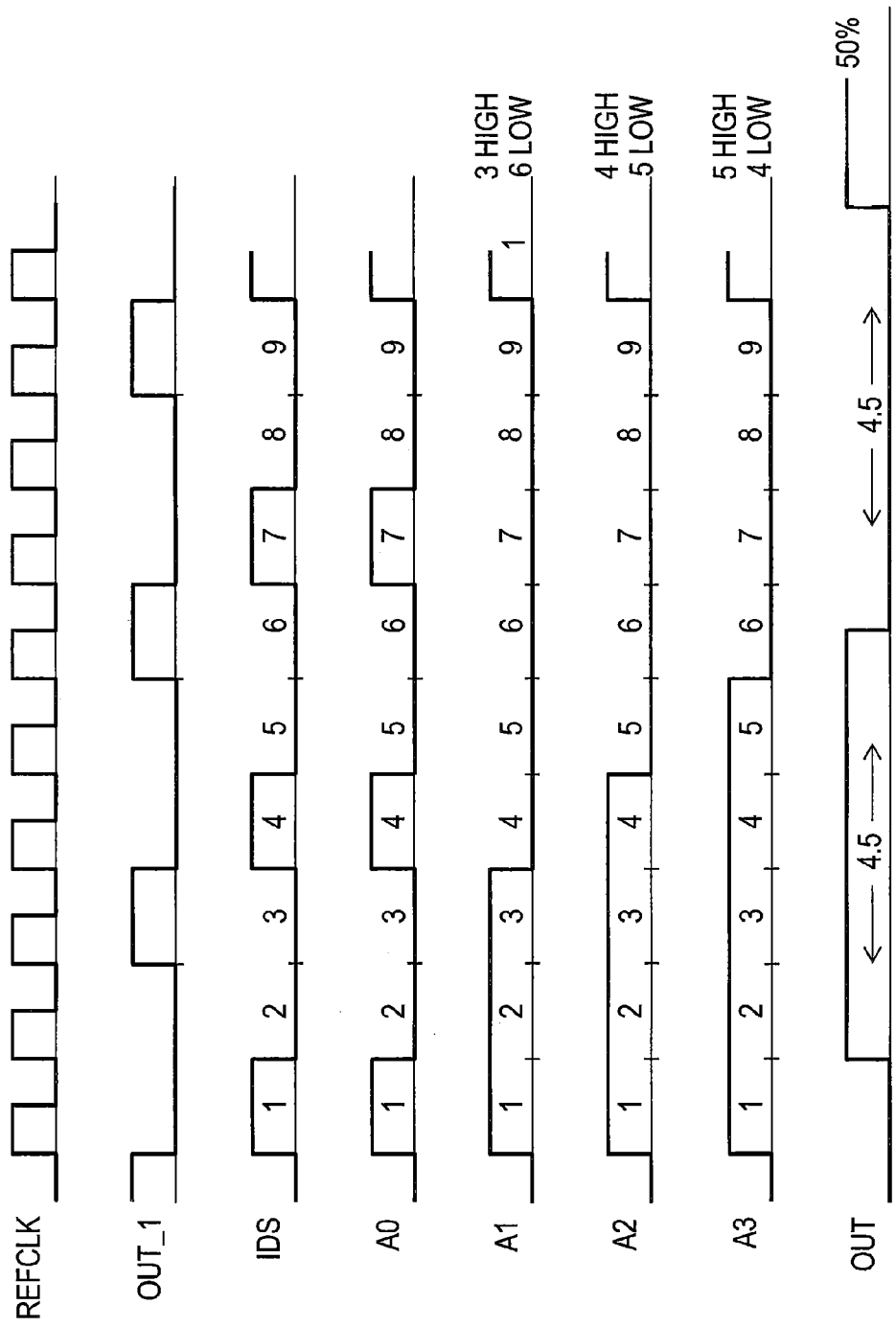
FIG. 5 is a timing diagram of signals that illustrate operation of the multi-stage frequency divider of FIGS. 1-4, according to embodiments of the present invention.

In particular, the duty cycle enhancement circuit 2Q generates the intermediate output signal OUT_INT by, among other things, performing multiple logical OR operations between the output signal A1 generated by the second integer divider 14 and a plurality of delayed versions of the output signal A1. For example, as shown by FIG. 3A, output signals A2, A3 are both generated based on different logical OR combinations (using OR gates 26, 28) so that A2=A1 $(1+z^{-1})$ and A3=A1$(1+z^{-2})$, where "+" designates a logical OR operation. Then, as shown by FIGS. 3B and 5, a multiplexer 25 may be used to generate the intermediate output signal OUT_INT as one of the output signals A0-A3, in response to a 2-bit control signal CNTL. For example, if the integer division performed by the first integer divider 12 is /3, then signal A2 will be selected as OUT_INT and if the integer division performed by the first integer divider 12 is /5, then signal A3 will be selected as OUT_INT.

Referring now FIG. 4, an embodiment of the duty cycle correction circuit 30 of FIG. 1 is illustrated as including a retimer circuit 32 and a multiplexer 34, which is responsive REFCLK as the multiplexer select signal. The retimer circuit 32 is configured to generate a first preliminary output signal POUT1 by performing a logical OR of a half-cycle delayed version of the intermediate output signal OUT_INT and a 1.5-cycle delayed version of the intermediate output signal OUT_INT. The retimer circuit 32 is also configured to generate a second preliminary output signal POUT2 as a one-cycle delayed version of the intermediate output signal OUT_INT. Still further, the duty cycle correction circuit 30 is configured to generate the periodic output signal OUT (with a 50% duty cycle) by multiplexing the first preliminary output signal POUT1 and the second preliminary output signal POUT2. As shown, the periodic reference signal REFCLK is used as a relatively high frequency multiplexer select signal for an output multiplexer 34, which means an output of the multiplexer 34 may toggle between the first and second preliminary output signals POUT1, POUT2 at relatively high frequency.

In this manner, the multi-stage frequency divider 100 of FIGS. 1-4 may be treated as including a cascaded arrangement of first and second integer dividers 12, 14, which are configured to collectively divide a frequency of a periodic reference signal REFCLK by an integer amount equal to a product of (2N+1) and (2M+1), where N and M are unequal positive integers greater than two. A duty cycle enhancement circuit 20 is provided, which is synchronized to the periodic reference signal REFCLK and configured to generate a periodic signal having 2MN+N+M cycles of high followed by 2MN+N+M+1 cycles of low or vice versa, as shown by FIG. 5, where a duration of each cycle is equivalent to a period of the periodic reference signal REFCLK. A duty cycle correction circuit 30 is provided as a final stage and is configured to generate a periodic output signal OUT having a uniform duty cycle from the periodic signal (e.g., OUT_INT) generated by the duty cycle enhancement circuit 20.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A multi-stage frequency divider, comprising:
a divider circuit responsive to a periodic reference signal to be divided, said divider circuit having at least first and second integer dividers therein, which are electrically coupled in a cascaded arrangement so that the second integer divider receives, at an input thereof, an intermediate divider signal derived from a first output of the first integer divider;
a duty cycle enhancement circuit configured to generate an intermediate output signal having an N/N+1 duty cycle in response to at least first and second output signals generated by said divider circuit, where: (i) N is a positive integer and 2N+1 equals a product of a first divide value of the first integer divider and a second divide value of the second integer divider, and (ii) at least one of the first and second output signals has a duty cycle less than the N/N+1 duty cycle; and
a duty cycle correction circuit configured to generate a periodic output signal having a uniform duty cycle and a period equal to the product times a period of the periodic reference signal, in response to the intermediate output signal having the N/N+1 duty cycle.

2. The multi-stage frequency divider of claim 1, wherein said divider circuit comprises a first retimer circuit configured to generate the intermediate divider signal by adjusting a phase of a periodic signal generated at the first output of the first integer divider.

3. The multi-stage frequency divider of claim 2, wherein the first retimer circuit is responsive to the periodic reference signal.

4. The multi-stage frequency divider of claim 1, wherein said duty cycle enhancement circuit and said duty cycle correction circuit are configured to collectively support generation of the periodic output signal having a uniform duty cycle when the first and second integer dividers are both supporting respective odd integer frequency division therein.

5. The multi-stage frequency divider of claim 1, wherein said duty cycle enhancement circuit is responsive to the periodic reference signal and is configured to delay an output signal generated by the second integer divider by M cycles of the periodic reference signal, where M is a positive integer and 2M+1 equals a magnitude of the frequency division performed by the first integer divider.

6. The multi-stage frequency divider of claim 5, wherein said duty cycle enhancement circuit is configured to generate an output signal by performing a logical OR of the output signal generated by the second integer divider and the M-cycle delayed version of the output signal generated by the second integer divider.

7. The multi-stage frequency divider of claim 1, wherein said duty cycle correction circuit is configured to generate a first preliminary output signal by performing a logical OR of a half-cycle delayed version of the intermediate output signal and a 1.5-cycle delayed version of the intermediate output signal.

8. The multi-stage frequency divider of claim 7, wherein said duty cycle correction circuit is further configured to generate a second preliminary output signal as a one-cycle delayed version of the intermediate output signal.

9. The multi-stage frequency divider of claim 8, wherein said duty cycle correction circuit is further configured to generate the periodic output signal by multiplexing the first preliminary output signal and the second preliminary output signal using the periodic reference signal as a multiplexer select signal.

10. A multi-stage frequency divider, comprising:
a cascaded arrangement of first and second integer dividers configured to collectively divide a frequency of a periodic reference signal by an integer amount equal to a product of (2N+1) and (2M+1), where N and M are unequal positive integers greater than two; and
a duty cycle enhancement circuit configured to generate a periodic signal having 2MN+N+M cycles of high followed by 2MN+N+M+1 cycles of low or vice versa, where a duration of each cycle is equivalent to a period of the periodic reference signal and said duty cycle enhancement circuit is synchronized to the periodic reference signal; and
a duty cycle correction circuit configured to generate a periodic output signal having a 50% duty cycle from the periodic signal generated by said duty cycle enhancement circuit.

* * * * *